United States Patent
Wang et al.

(10) Patent No.: US 11,087,808 B1
(45) Date of Patent: Aug. 10, 2021

(54) WORD-LINE STRUCTURE, MEMORY DEVICE AND METHOD OF MANUFACTURING THE SAME

(71) Applicant: Winbond Electronics Corp., Taichung (TW)

(72) Inventors: Li-Ting Wang, Taichung (TW); Ming-Chung Chiang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/928,016

(22) Filed: Jul. 14, 2020

(51) Int. Cl.
*G11C 8/14* (2006.01)
*H01L 27/108* (2006.01)

(52) U.S. Cl.
CPC ............ *G11C 8/14* (2013.01); *H01L 27/1085* (2013.01); *H01L 27/10891* (2013.01)

(58) Field of Classification Search
None
See application file for complete search history.

(56) References Cited

U.S. PATENT DOCUMENTS

| 7,713,828 | B2 | 5/2010 | Yuki |
| 9,754,943 | B1 * | 9/2017 | Chang ............... H01L 23/528 |
| 2012/0012925 | A1 | 1/2012 | Oh |

FOREIGN PATENT DOCUMENTS

| TW | 201622070 | 6/2016 |
| TW | I582956 | 5/2017 |
| TW | I678793 | 12/2019 |

OTHER PUBLICATIONS

"Office Action of Taiwan Counterpart Application", dated Nov. 27, 2020, p. 1-p. 6.

* cited by examiner

*Primary Examiner* — James G Norman
(74) *Attorney, Agent, or Firm* — JCIPRNET

(57) ABSTRACT

Provided is a word-line structure including a substrate, a word line, and an epitaxial pattern. The word line is embedded in the substrate. The word line includes a conductive layer, a barrier layer, an insulating layer, and a gate dielectric layer. The barrier wraps a lower portion of the conductive layer. The insulating layer wraps an upper portion of the conductive layer. The gate dielectric layer surrounds the insulating layer and the barrier layer to electrically isolate the barrier layer from the substrate. The epitaxial pattern is disposed between the insulating layer and the substrate and in contact with the substrate. A memory device including the word-line structure and a method of manufacturing the same are also provided.

20 Claims, 17 Drawing Sheets

WORD-LINE STRUCTURE, MEMORY DEVICE AND METHOD OF MANUFACTURING THE SAME

BACKGROUND OF THE INVENTION

Field of the Invention

The present invention relates to a word-line structure, a memory device including the word-line structure, and a method of manufacturing the memory device.

Description of Related Art

A dynamic random access memory (DRAM) is a volatile memory formed by a plurality of memory cells. Each of the memory cells is mainly composed of a transistor and a capacitor controlled by the transistor, and the memory cells are electrically connected with one another through word lines and bit lines. In order to improve the integration of DRAM to increase the operating speed of the device and to meet the consumers' demand for miniaturization of electronic devices, buried word line DRAM has been developed in recent years for the aforementioned purposes.

With development of technology, electronic products are developed to have design features of lightness, slimness, shortness and smallness. In this case, the critical dimension of the DRAM is also reduced, which result in many challenges for the DRAM process.

SUMMARY OF THE INVENTION

The invention provides a word-line structure, a memory device including the word-line structure, and a method of manufacturing the memory device, which is able to increase a contact area between the capacitor contact and the active area, and reduce the resistance of the capacitor contact, thereby enhancing the reliability and the process window of the memory device.

The invention provides a word-line structure including a substrate, a word line, and an epitaxial pattern. The word line is embedded in the substrate. The word line includes a conductive layer, a barrier layer, an insulating layer, and a gate dielectric layer. The barrier wraps a lower portion of the conductive layer. The insulating layer wraps an upper portion of the conductive layer. The gate dielectric layer surrounds the insulating layer and the barrier layer to electrically isolate the barrier layer from the substrate. The epitaxial pattern is disposed between the insulating layer and the substrate and in contact with the substrate.

The invention provides a memory device including a substrate, a plurality of word lines, a plurality of capacitors, a plurality of capacitor contacts, and a plurality of epitaxial layers. The substrate has a plurality of active areas. The plurality of word lines are disposed in parallel in the substrate along a Y direction. The plurality of capacitors are respectively disposed on two terminals of long sides of the plurality of active areas. The plurality of capacitor contacts are respectively disposed between the plurality of capacitors and the plurality of active areas. The plurality of epitaxial layers, respectively disposed between the plurality of word lines and the plurality of active areas, wherein the plurality of epitaxial layers laterally extend from upper sidewalls of the substrate into the plurality of word lines respectively.

The invention provides a method of manufacturing a memory device including: providing a substrate having a plurality of active areas; forming a plurality of word lines in the substrate, the plurality of word lines extending along a Y direction and penetrating through the plurality of active areas; removing a portion of the plurality of word lines at a first side to form a plurality of openings, the plurality of openings at least expose upper sidewalls of the substrate in the plurality of active areas; performing an epitaxial growth process to form a plurality of epitaxial layers on the upper sidewalls of the substrate; and filling in the plurality of openings with an insulating material.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
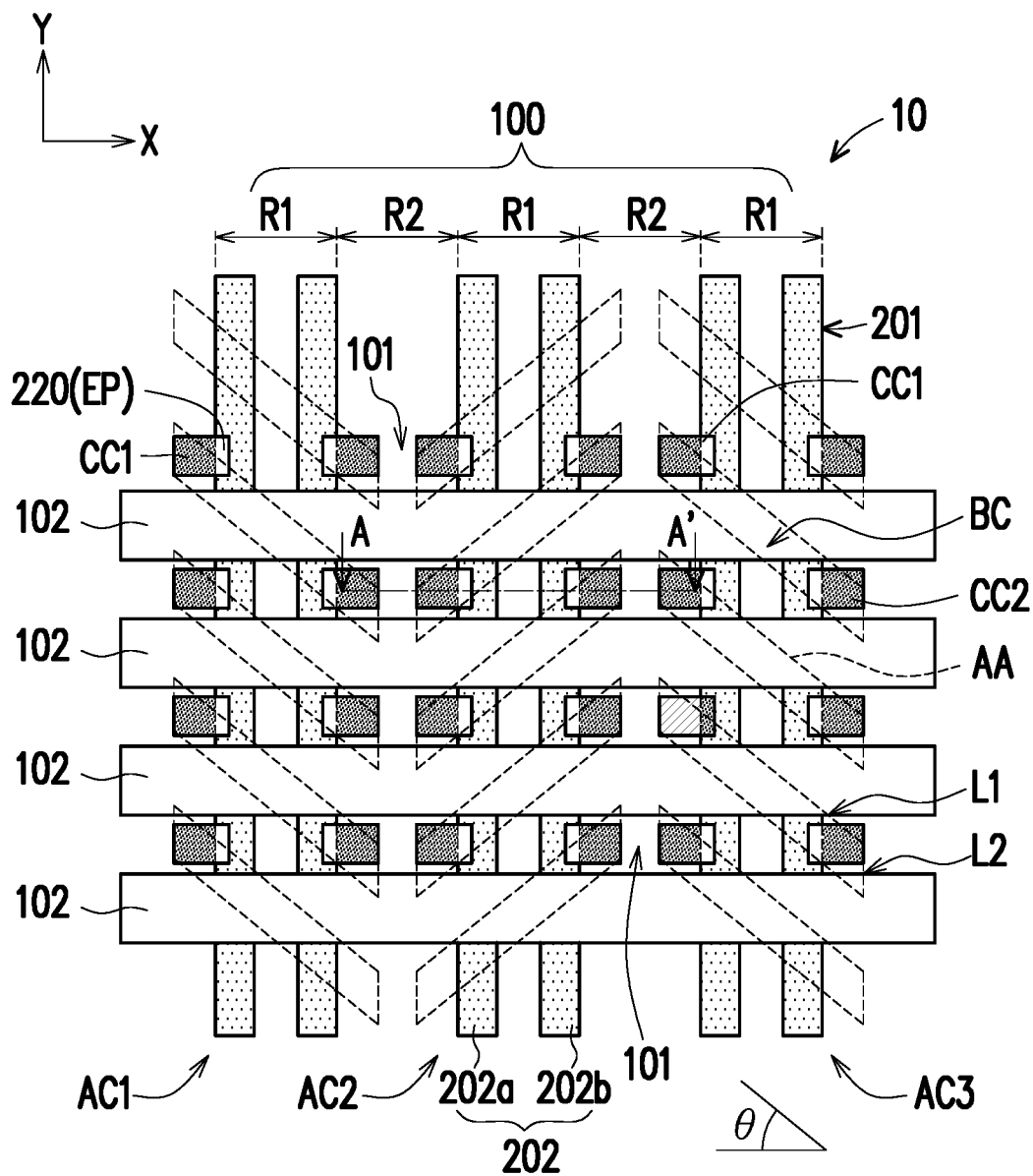
FIG. 1 is a schematic top view of a memory device according to an embodiment of the invention.

The invention is more blanketly described with reference to the figures of the present embodiments. However, the invention can also be implemented in various different forms, and is not limited to the embodiments in the present specification. The thicknesses of the layers and regions in the figures are enlarged for clarity. The same or similar reference numerals represent the same or similar devices and are not repeated in the following paragraphs.

FIG. 1 is a schematic top view of a memory device according to an embodiment of the invention. The memory device described in the following embodiment is taken a dynamic random access memory (DRAM) as an example, but the invention is not limited thereto.

Referring to FIG. 1, the present embodiment provides a memory device 10 including a substrate 100, a plurality of isolation structures 101, a plurality of active areas AA, a plurality of bit-line structures 102, a plurality of word line sets 202, a plurality of capacitor contacts CC1 and CC2, and an epitaxial pattern EP. For clearness of the figure, FIG. 1 only illustrates the aforementioned elements, and other elements may refer to the cross-sectional views illustrated in subsequent FIGS. 2A to 2R.

As shown in FIG. 1, the substrate 100 includes a plurality of first regions R1 and a plurality of second regions R2. The first regions R1 and the second regions R2 are alternately arranged in an X direction. The isolation structures 101 are disposed in the substrate 100 to define the active areas AA in the substrate 100. In other words, one isolation structures 101 is provided between adjacent two active areas AA. In an embodiment, only one memory cell is formed on one active area AA, and each of the memory cells is separated by the isolation structures 101, so as to effectively reduce an interference issue among the memory cells. Specifically, the active areas AA are configured in a shape of band and arranged in an array. In the present embodiment, the active areas AA are arranged in three active area columns AC1 to AC3, and adjacent two active area columns are disposed in a mirror manner. For instance, a long-side direction of the active area column AC3 and the X direction are not orthogonal to each other and have an included angle θ, and a long-side direction of the active area column AC2 and the X direction are not orthogonal to each other and have an included angle (180°−θ). In an embodiment, the included angle θ may range between 36 degrees and 37 degrees. However, the invention is not limited thereto, in other embodiments, adjacent two active area columns may also be disposed in the same manner.

The bit-line structures 102 are located on the substrate 100 and cross the first regions R1 and the second regions R2. The bit-line structures 102 extend in the X direction and are arranged with each other along a Y direction. The word line sets 202 are located in the first regions R1 of the substrate 100. The word line sets 202 are disposed along the Y direction and arranged with each other in the X direction. Each word line set 202 has two buried word lines 202a and 202b. In an embodiment, the X direction and the Y direction are substantially perpendicular to each other.

In the present embodiment, each active area AA has a long side L1 and a short side L2, and the long side L1 crosses the corresponding word line set 202 (i.e., including two buried word lines 202a and 202b), and an overlapping area of each active area AA and its corresponding bit-line structure 102 has a bit line contact BC. Thus, each bit-line structure 102 crossing its corresponding word line set 202, may be electrically connected with a corresponding doped region (not shown) through the bit line contact BC. The doped region is located between the two buried word lines 202a and 202b.

The capacitor contacts CC1 and CC2 are located on the substrate 100 between the bit-line structures 102. Specifically, the capacitor contacts CC1 and CC2 are respectively disposed at two terminals of the long side L1 of each active area AA and may electrically connect the active areas AA with subsequently formed capacitors (not shown). In addition, although the capacitor contacts CC1 and CC2 are presented in a rectangular shape in FIG. 1, the actually formed contacts is slightly represented in a circular shape and sizes thereof may be designed based on process requirements.

It should be noted that, as shown in FIG. 1, the epitaxial pattern EP has a plurality of epitaxial layers 220. In one embodiment, the epitaxial layers 220 are separated from each other along the Y direction and are discontinuously disposed on one side of the word lines 202a, 202b. Specifically, the epitaxial layers 220 are respectively disposed at the overlapping positions of the capacitor contacts CC1 and CC2 and the word lines 202a and 202b. In the top view, the epitaxial layers 220 are located within the range of the word lines 202a, 202b. In the case, the epitaxial layers 220 of the embodiment are able to increase the contact areas between the capacitor contacts CC1, CC2 and the active areas AA, so as to reduce the resistance of the capacitor contacts CC1, CC2, thereby enhancing the reliability and the process window of the memory device 10.

Figure 2A:
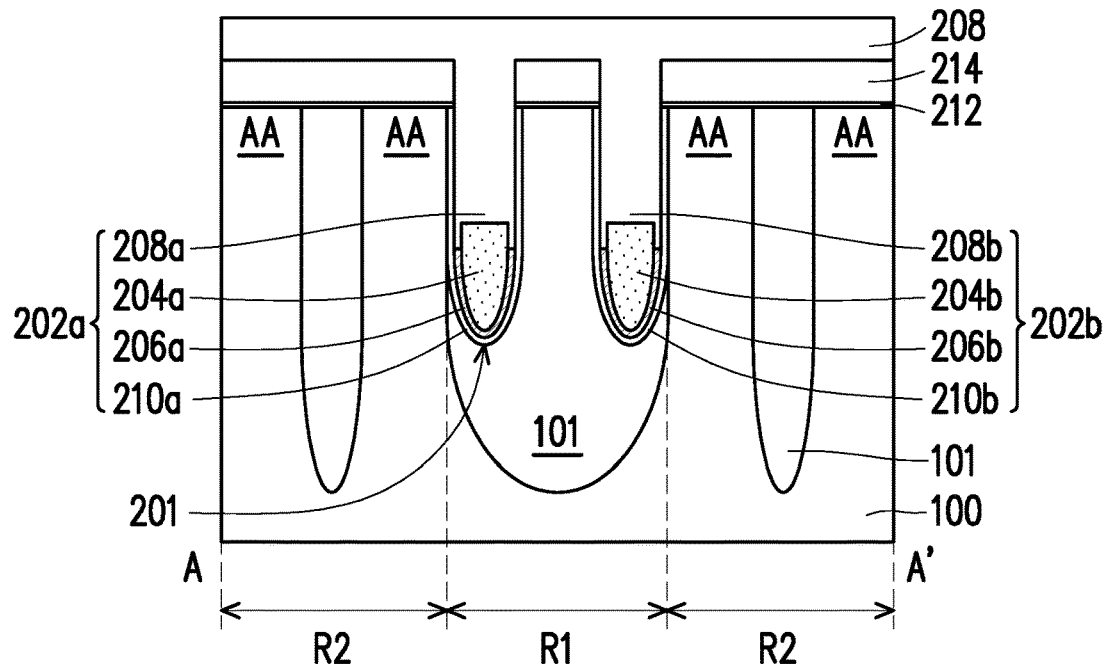
FIG. 2A to FIG. 2R are schematic cross-sectional views of a manufacturing process of the memory device along a line A-A' depicted in FIG. 1.
Figure 2B:
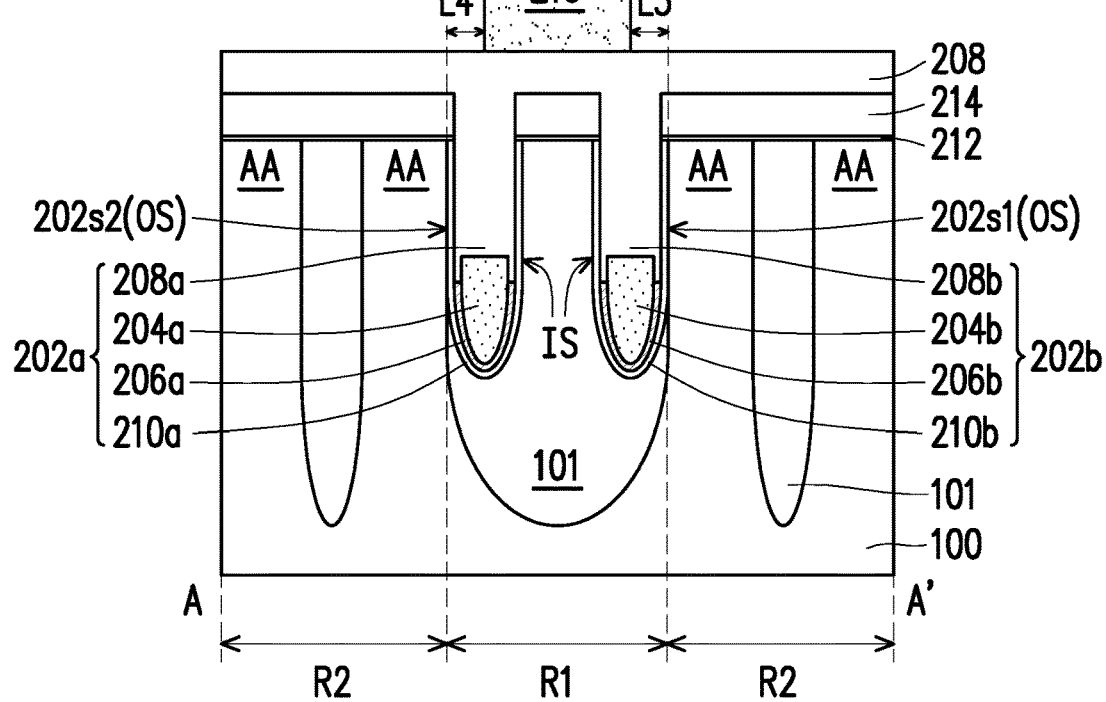
Figure 2C:
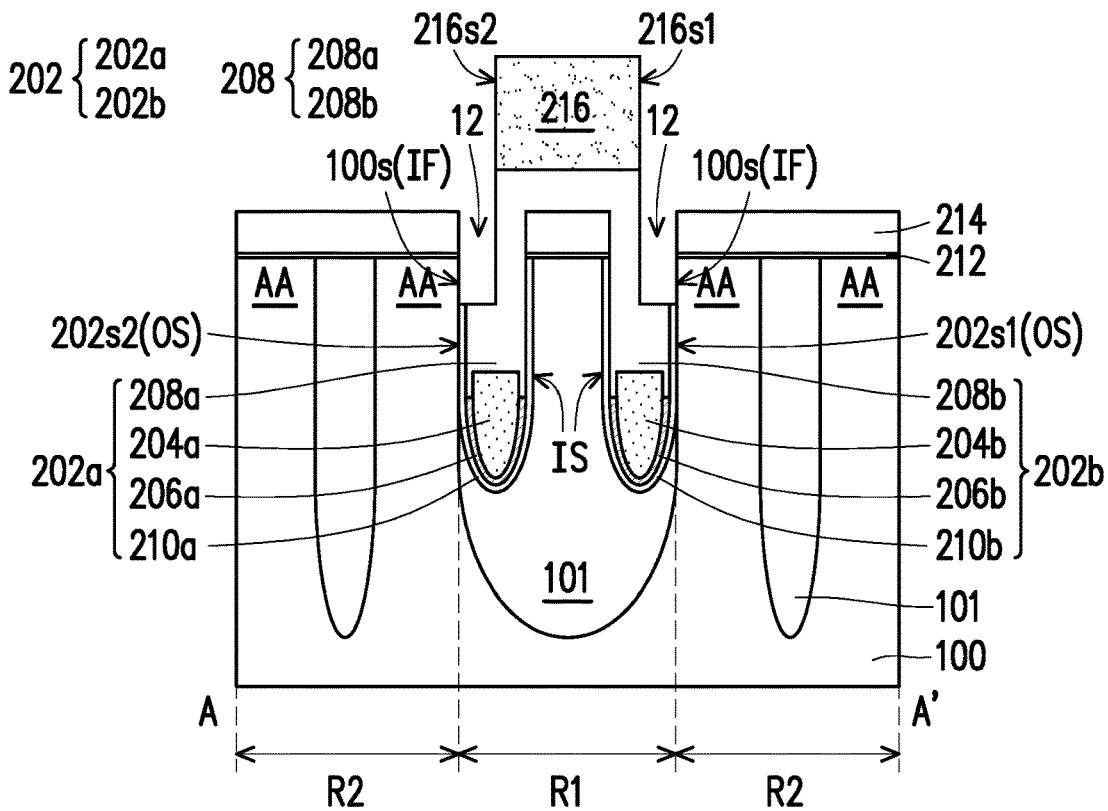
Figure 2D:
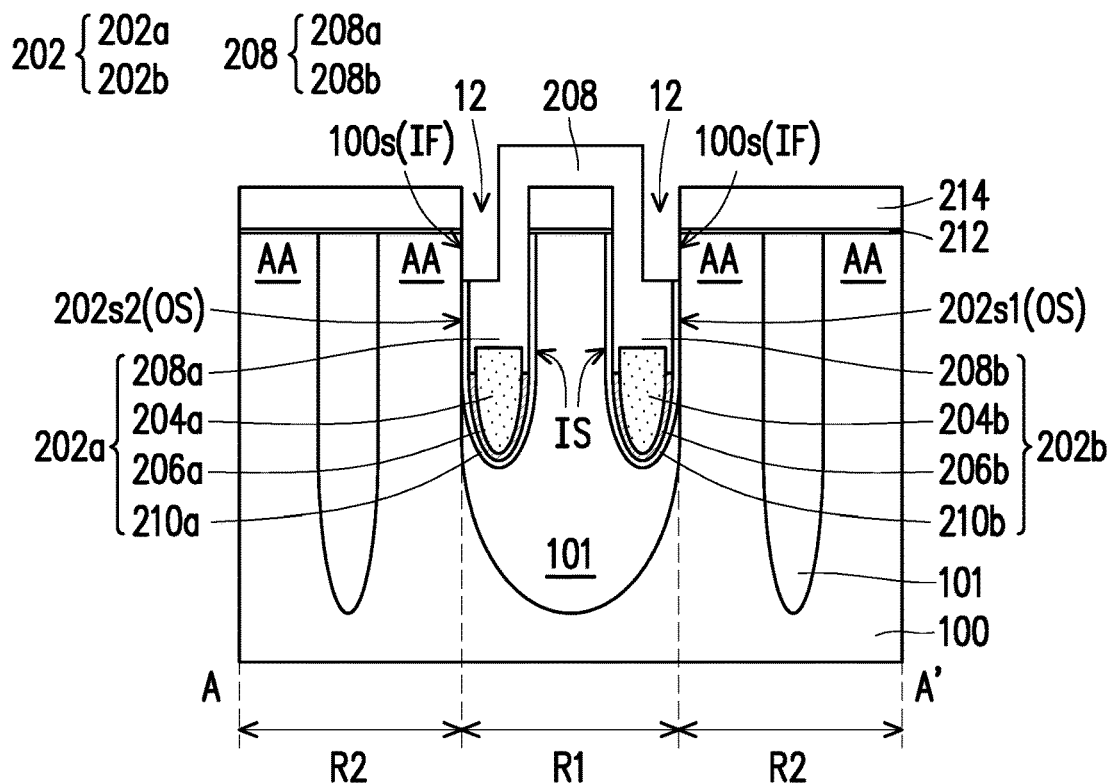
Figure 2E:
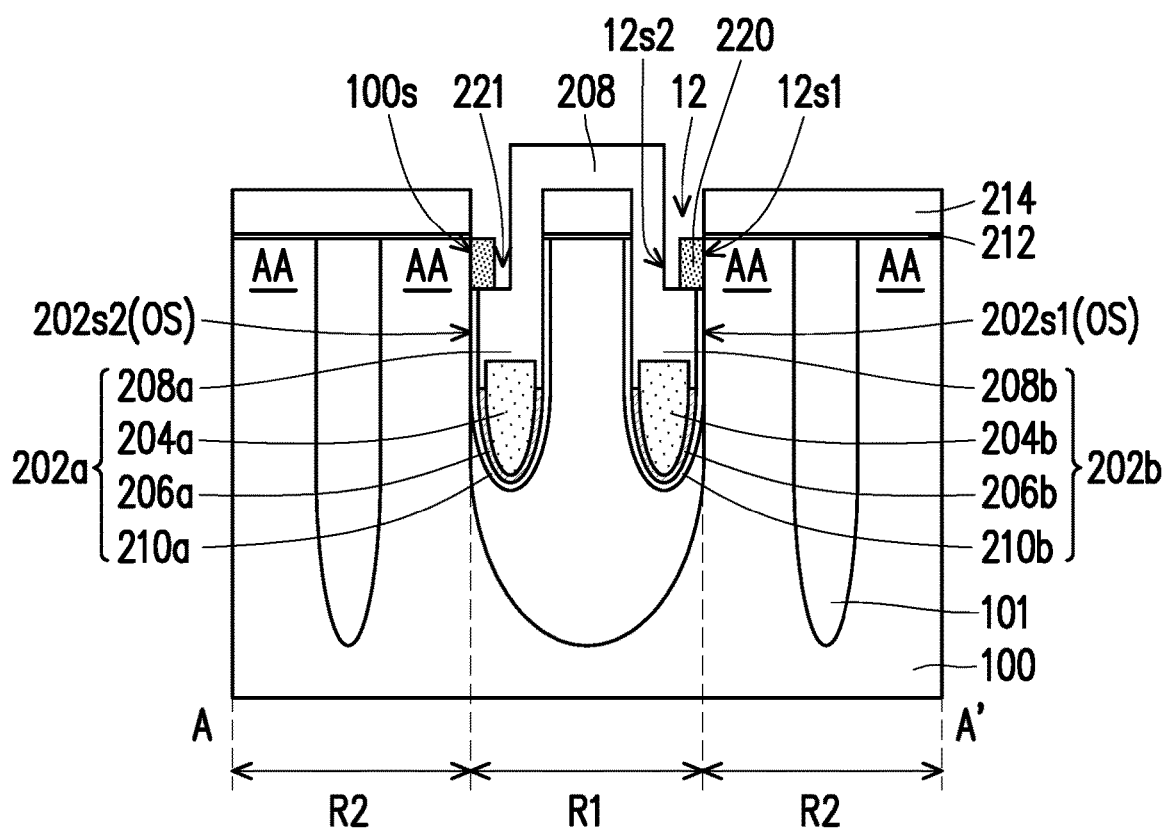
Figure 2F:
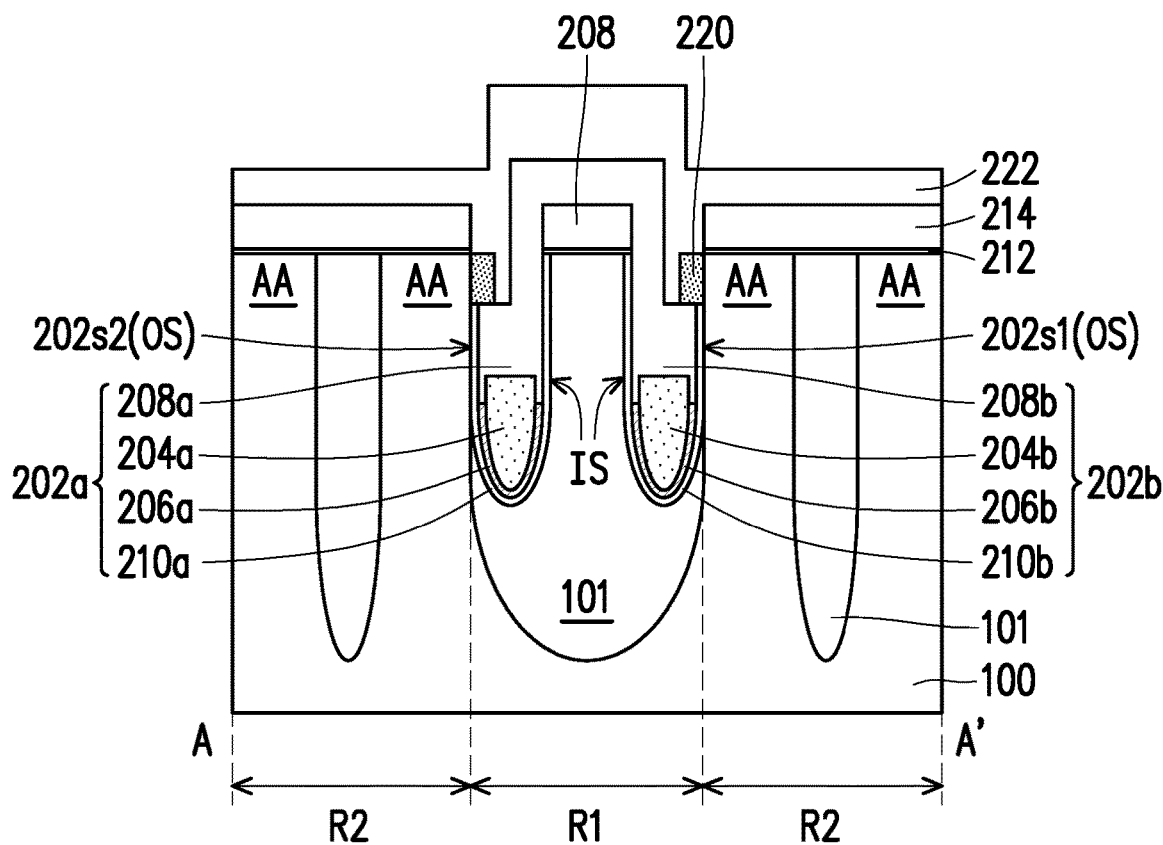
Figure 2G:
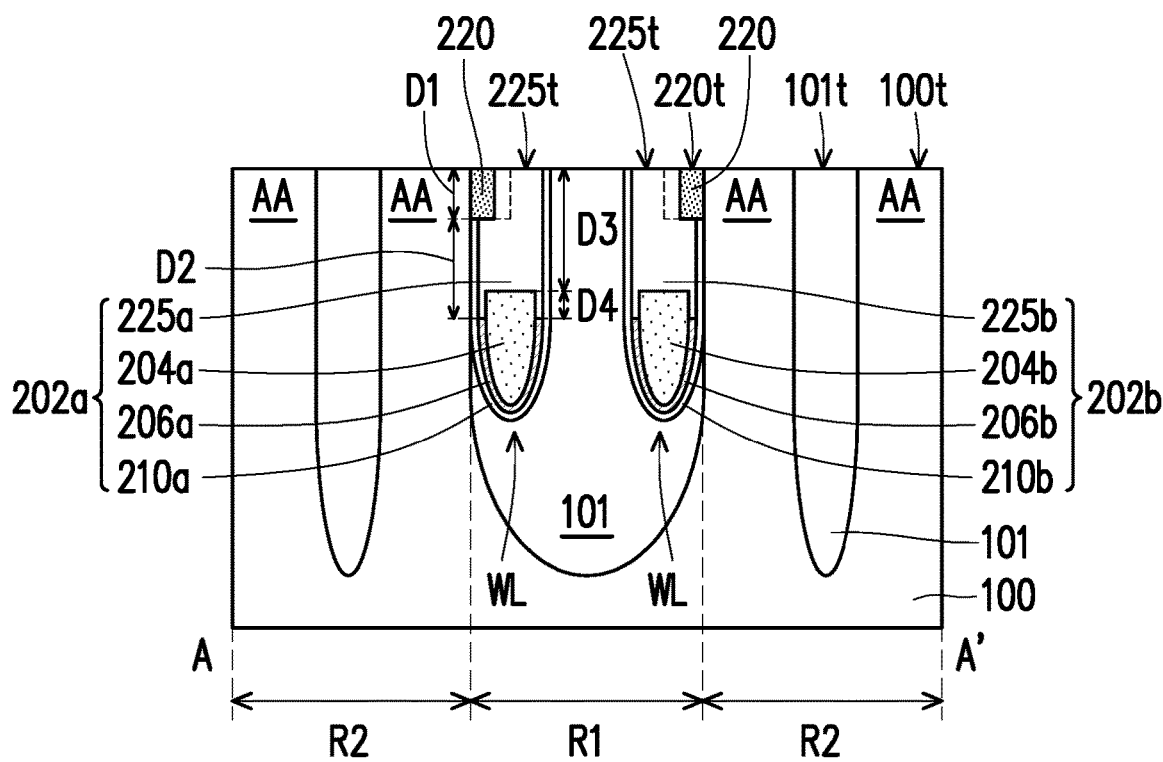
Figure 2H:
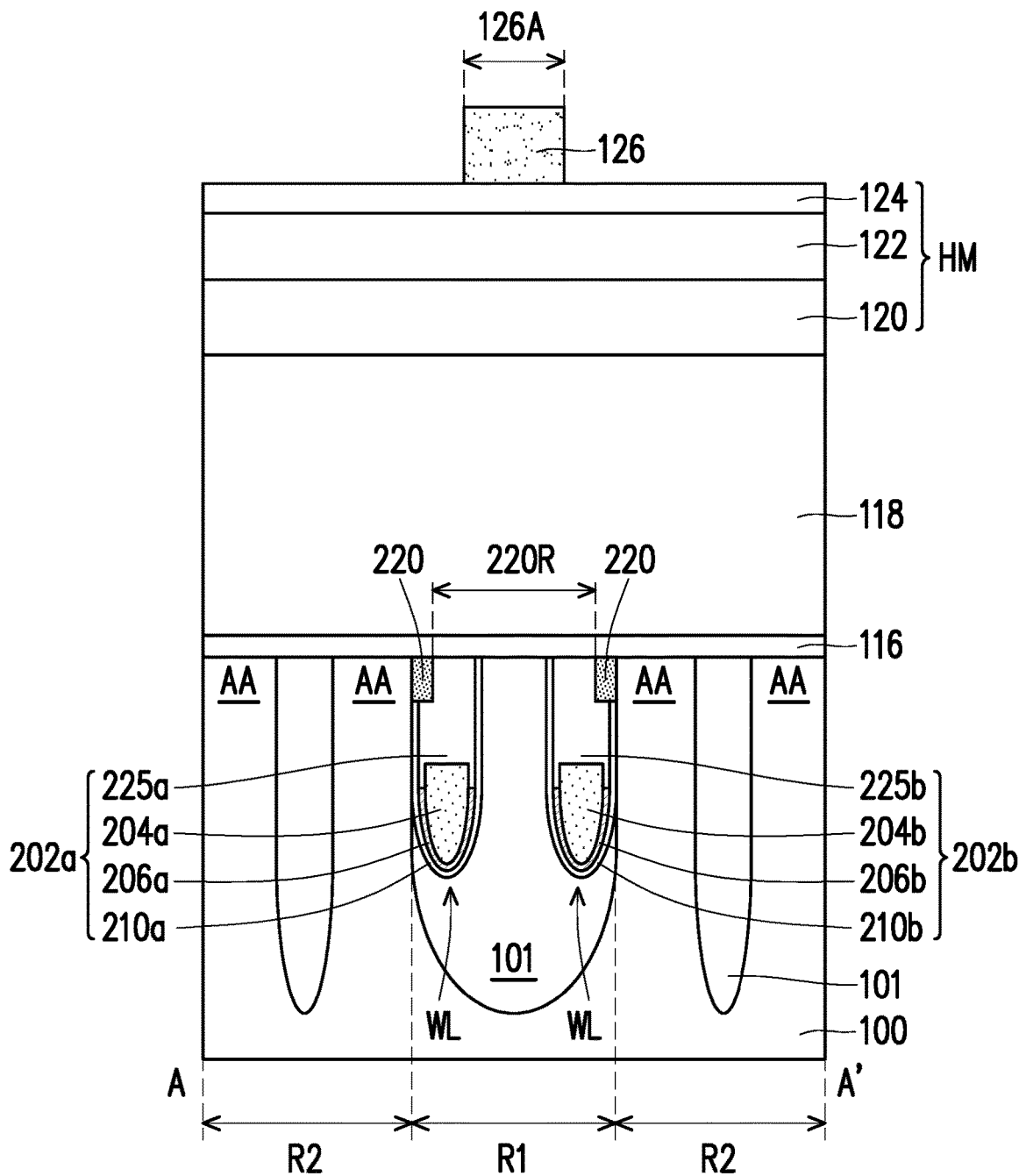
Figure 2I:
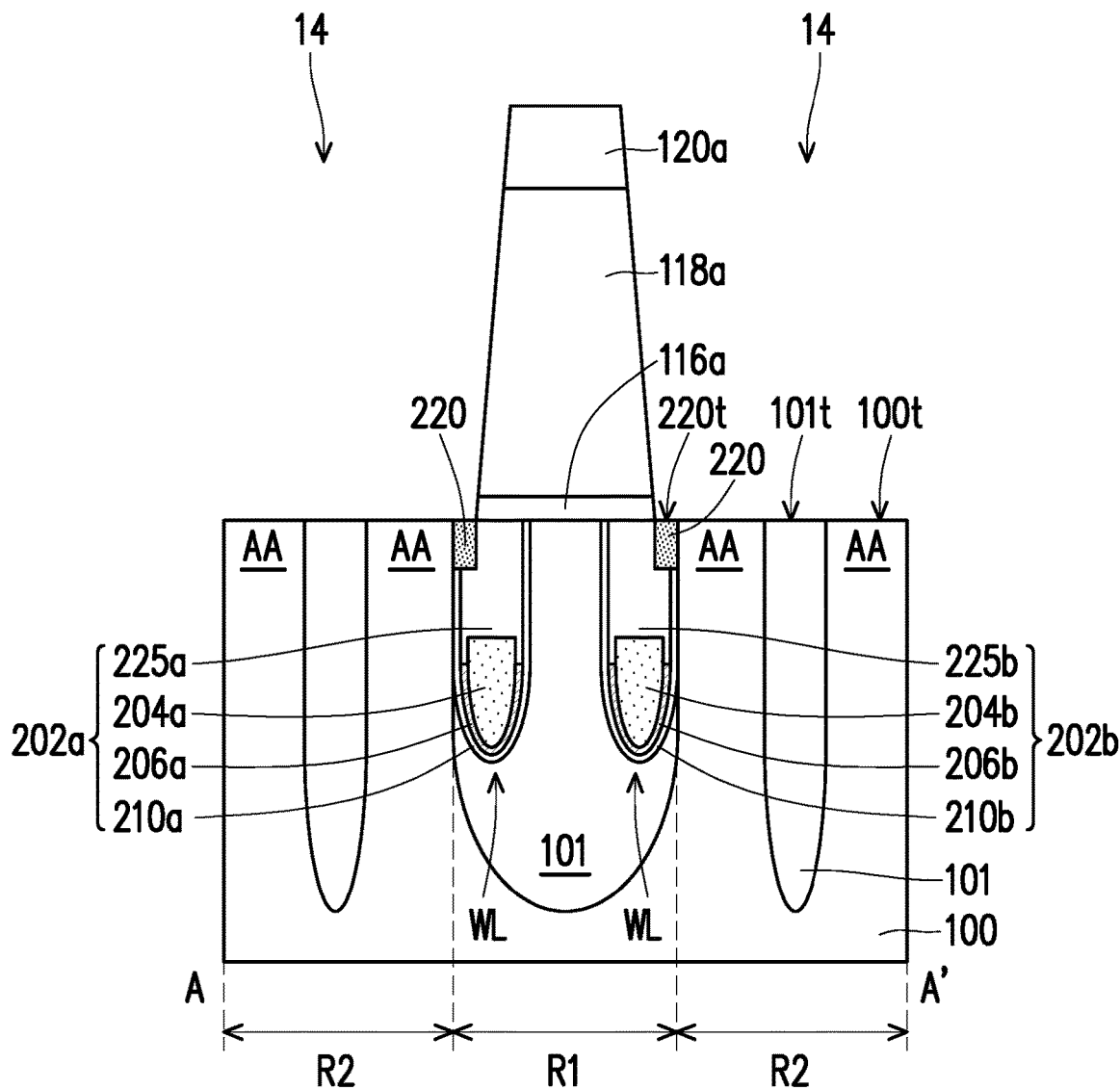
Figure 2J:
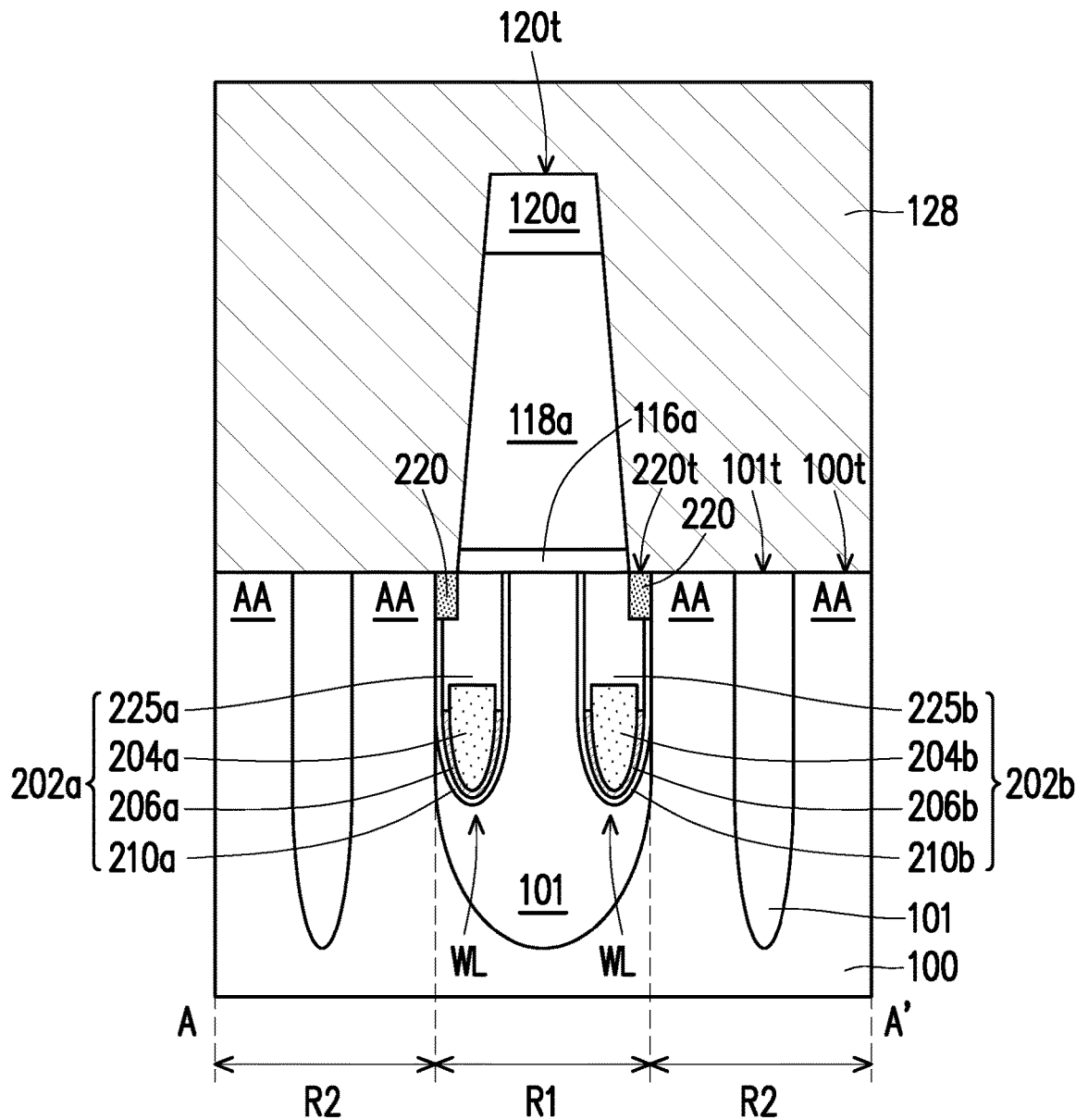
Figure 2K:
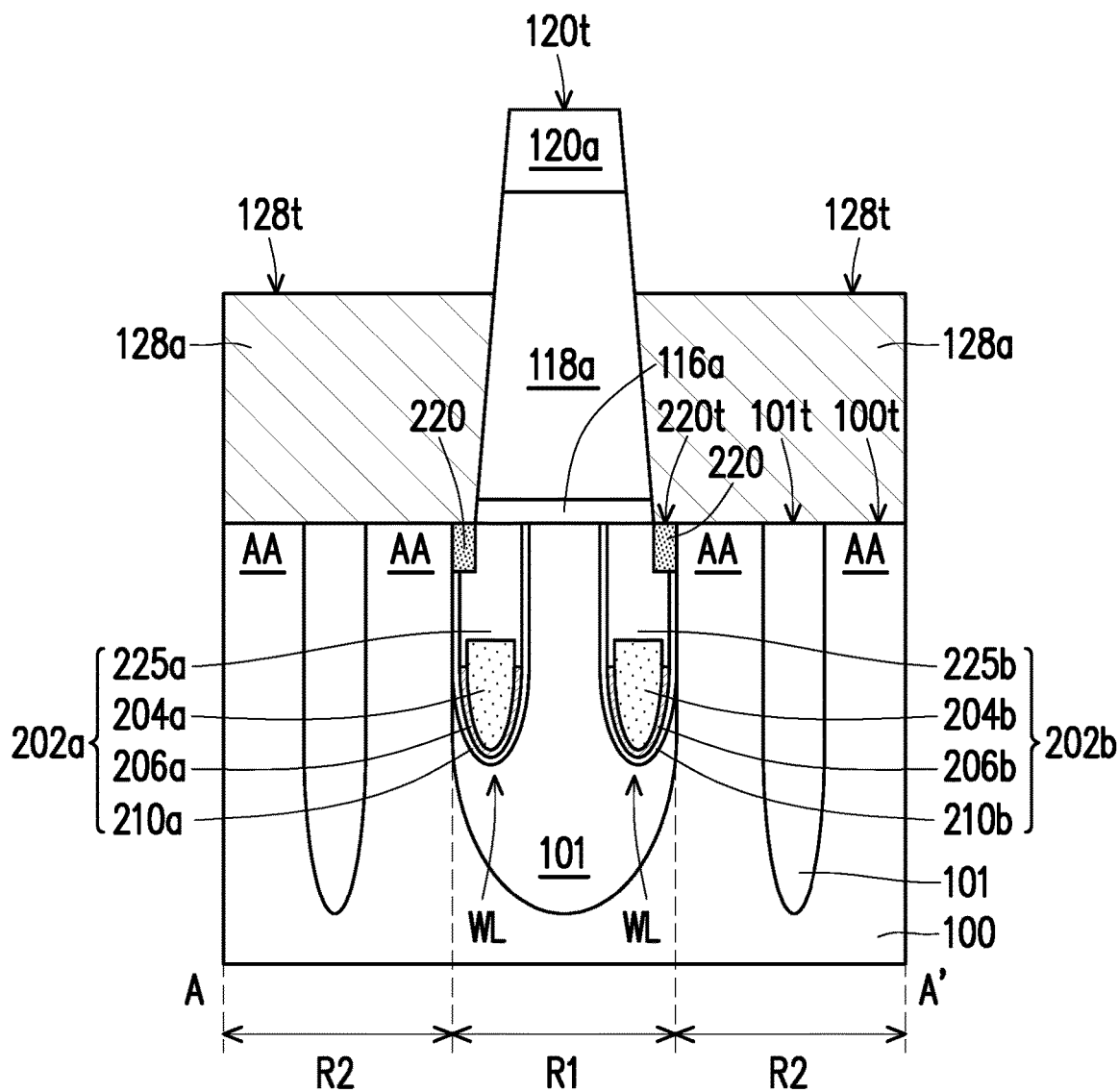
Figure 2L:
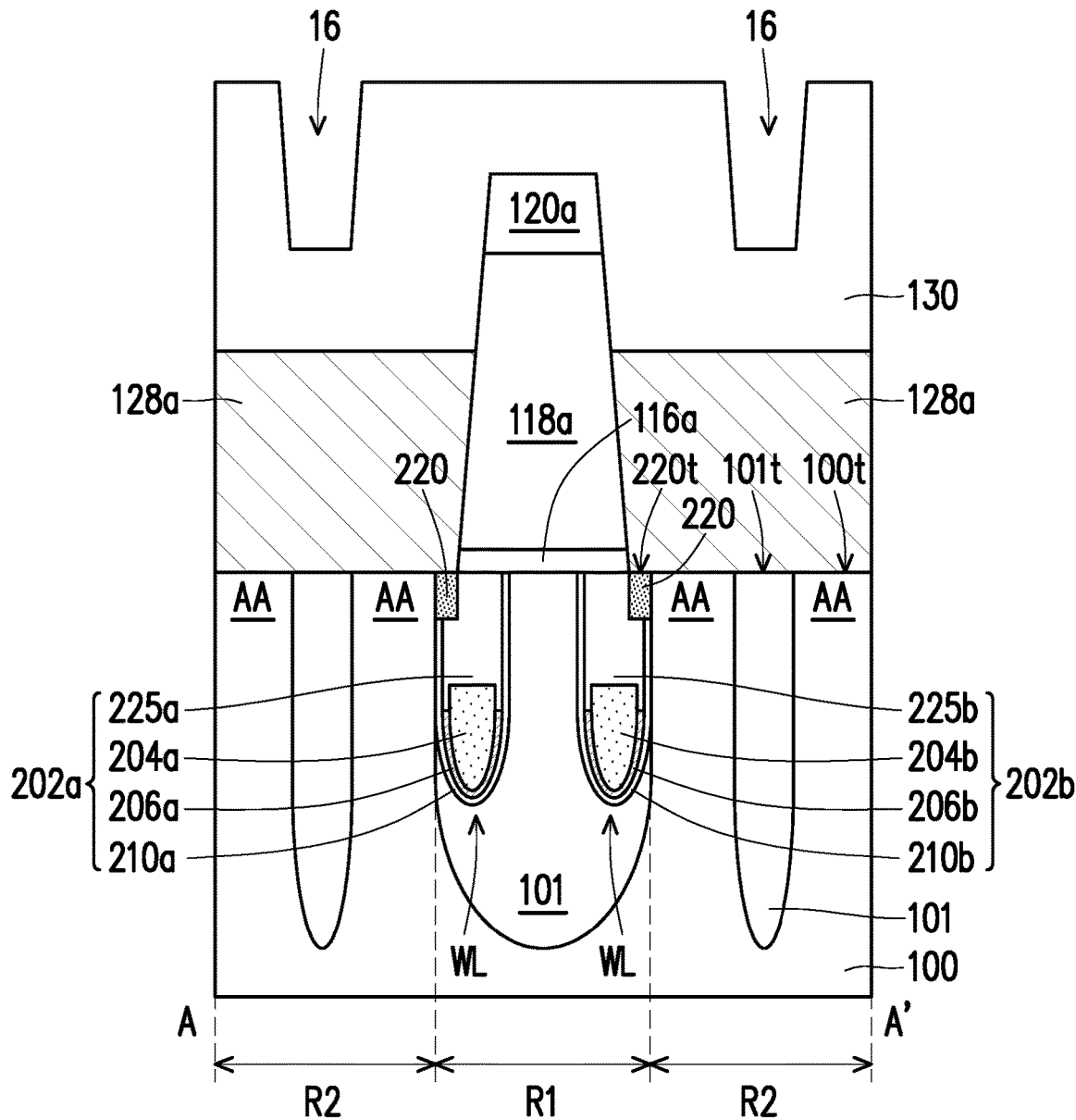
Figure 2M:
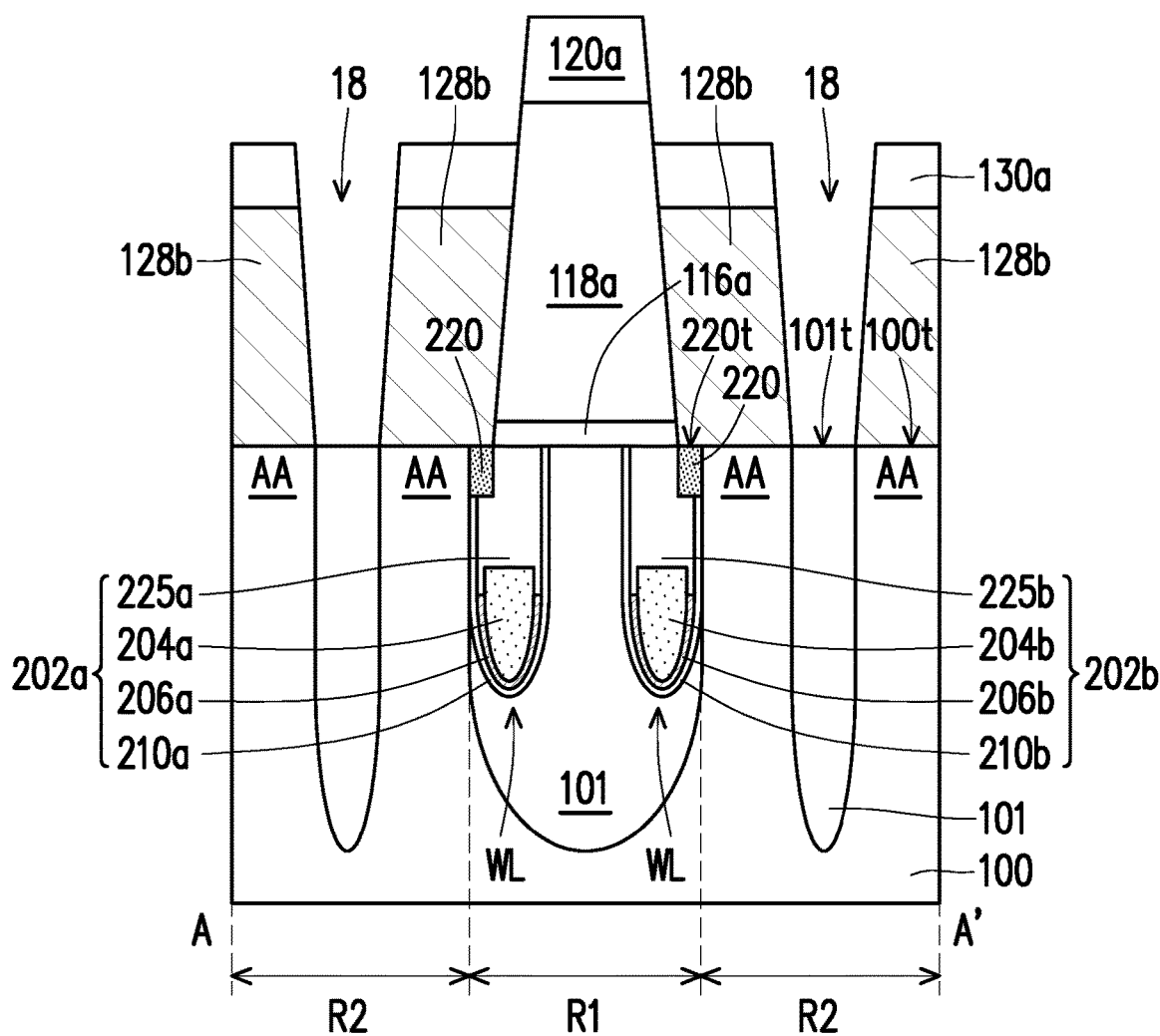
Figure 2N:
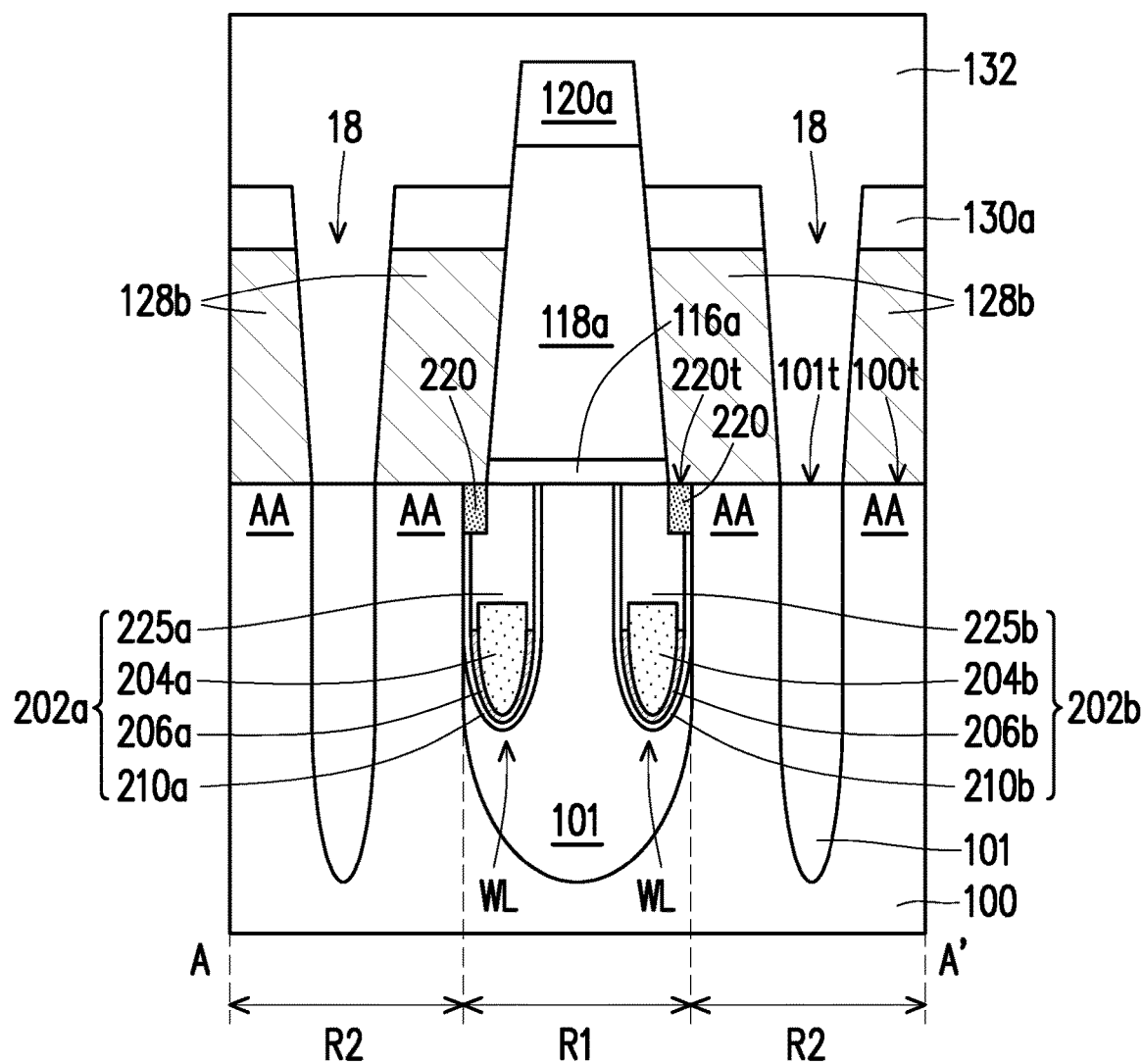
Figure 20:
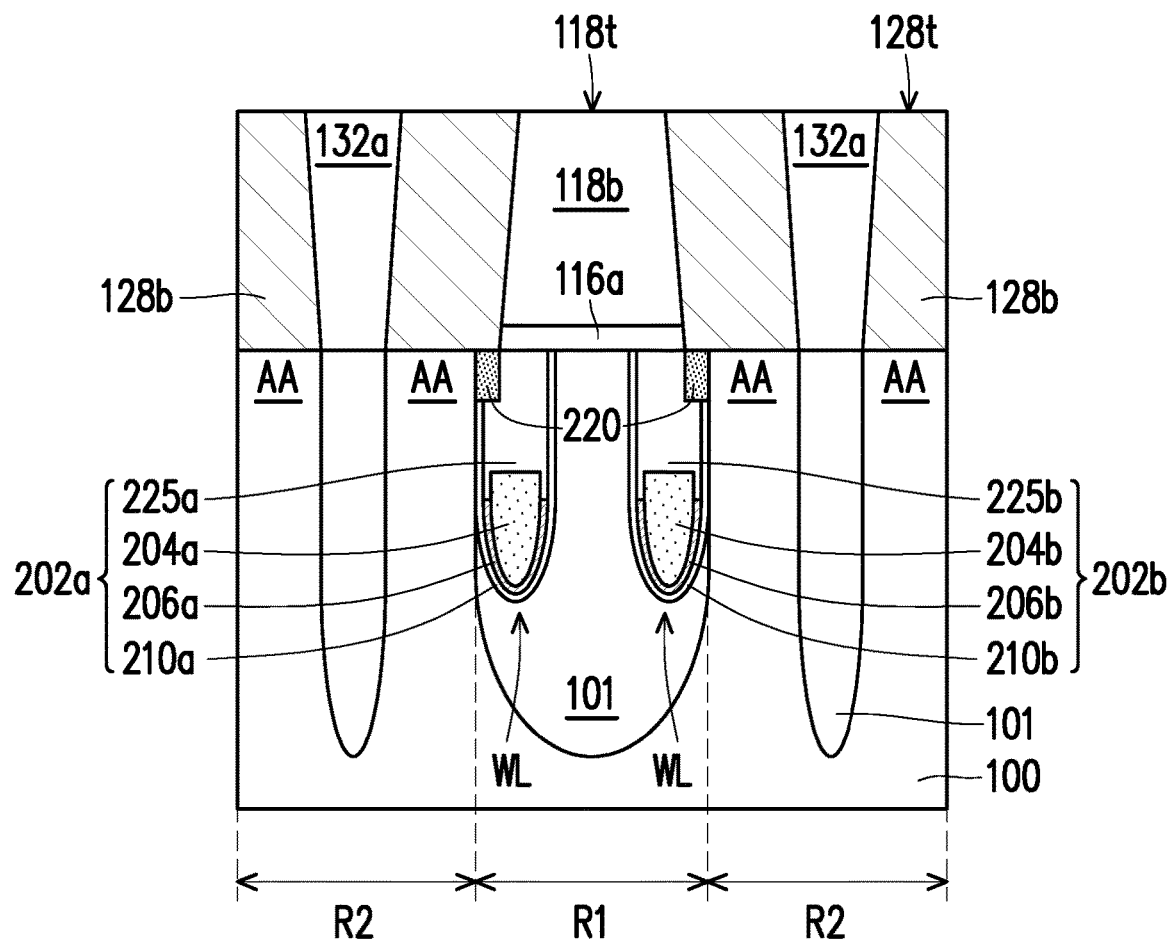
Figure 2P:
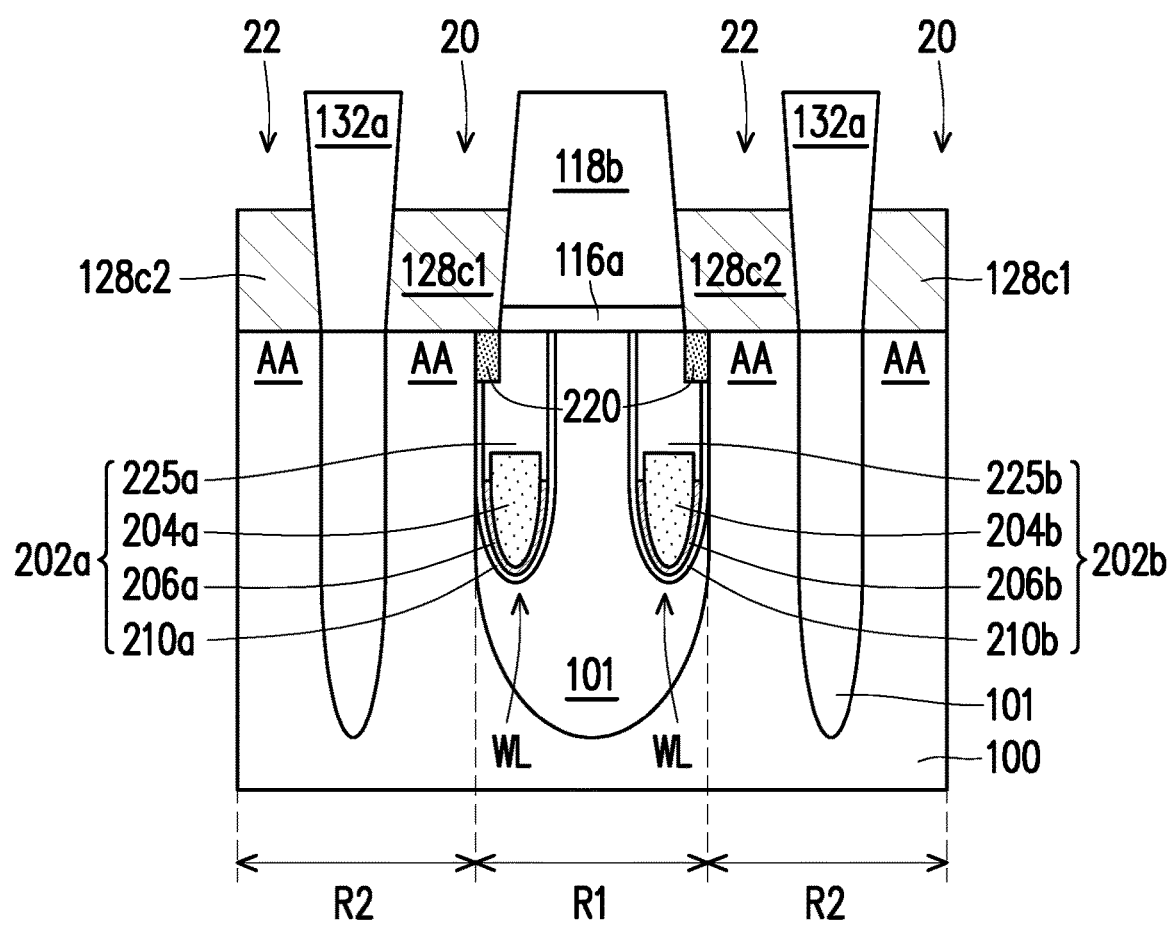
Figure 2Q:
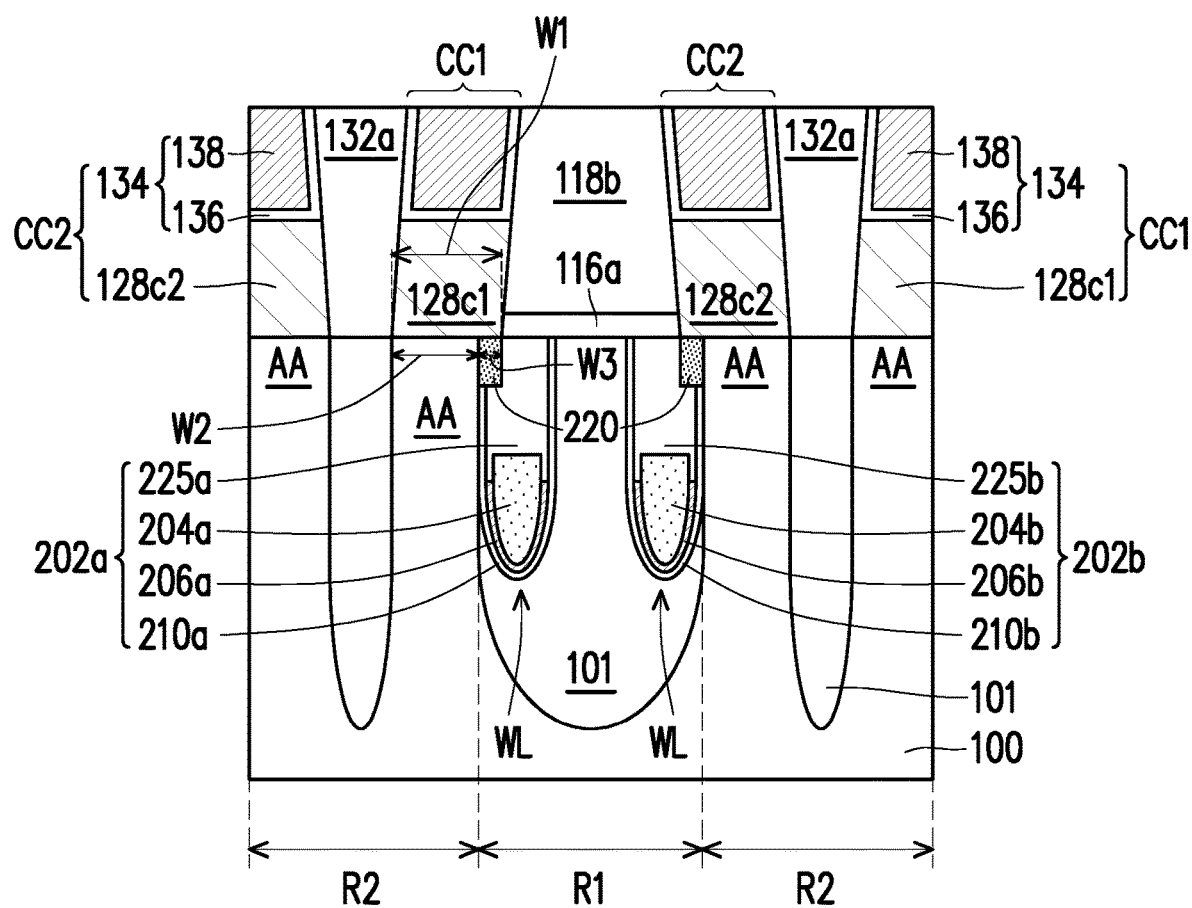
Figure 2R:
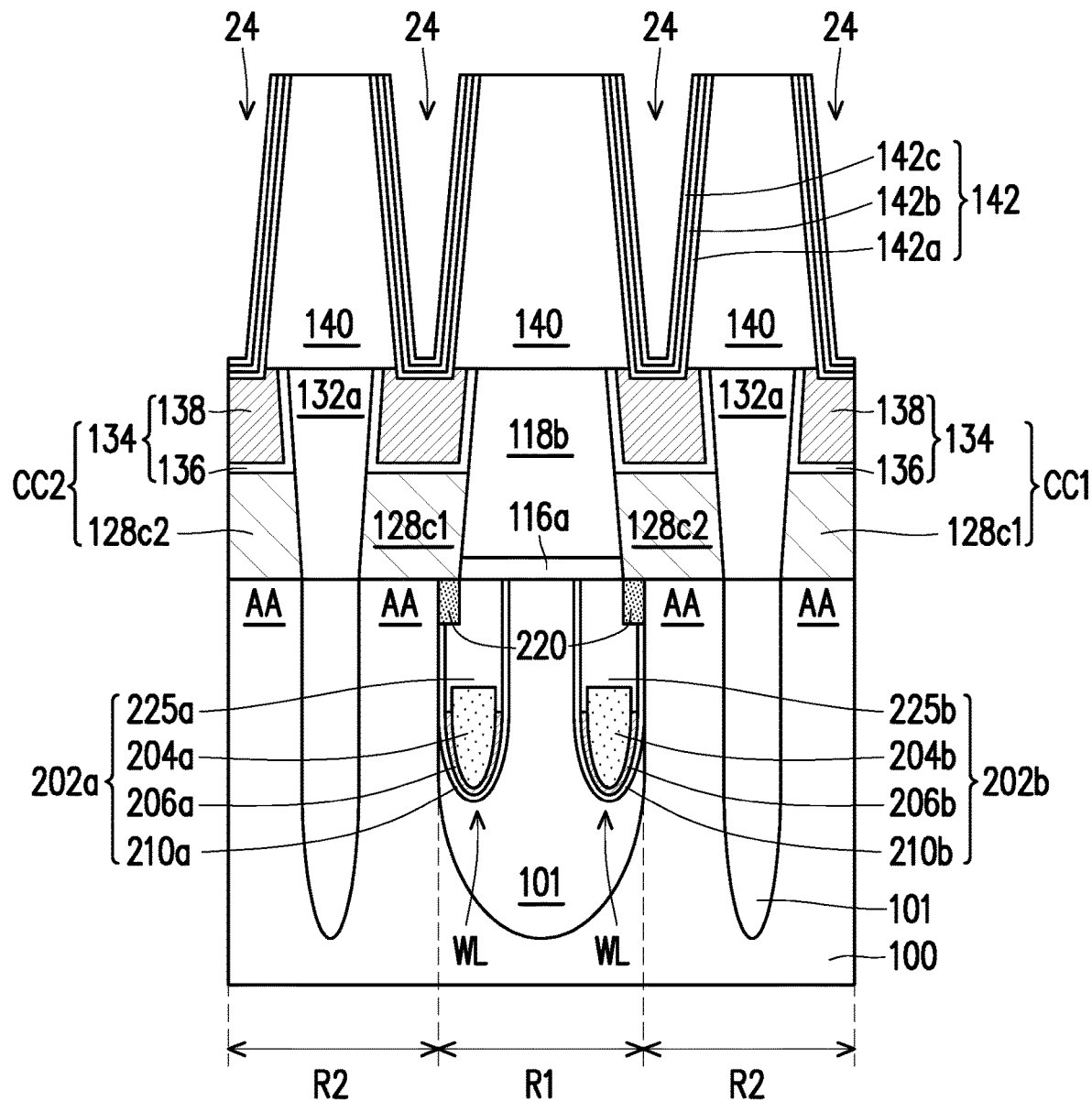

FIG. 2A to FIG. 2R are schematic cross-sectional views of a manufacturing process of the memory device along a line A-A' depicted in FIG. 1.

Referring to FIG. 1 and FIG. 2A simultaneously, first, an initial structure including the substrate 100, the plurality of isolation structures 101, and the word line sets 202 is provided. In an embodiment, the substrate 100 may be, for example, a semiconductor substrate, a semiconductor compound substrate or a semiconductor over insulator (SOI). In the embodiment, the substrate 100 is a silicon substrate.

As shown in FIG. 1 and FIG. 2A, the isolation structures 101 are disposed in the substrate 100 to divide the substrate 100 into a plurality of active areas AA. In an embodiment, the isolation structures 101 include a dielectric material, and the dielectric material may be silicon oxide. In another embodiment, the isolation structures 101 may be shallow trench isolation (STI) structures, for example.

As shown in FIG. 2A, the plurality of word line sets 202 are arranged in the substrate 100 of the first region R1. In detail, each word line set 202 includes two buried word lines 202a and 202b. The buried word line 202a includes a conductive layer 204a, a barrier layer 206a, and a gate dielectric layer 210a. The barrier layer 206a wraps a lower portion of the conductive layer 204a. That is, the conductive layer 204a protrudes from a top surface of the barrier layer 206a, so that the top surface of the conductive layer 204a is higher than a top surface of the barrier layer 206a. The gate dielectric layer 210a surrounds the barrier layer 206a to electrically isolate the barrier layer 206a from the substrate 100. In an embodiment, the conductive layer 204a may be regarded as a gate electrode, and a material of the conductive layer 204a includes a conductive material, which may be a metal material, a barrier metal material, or a combination thereof, for example. A material of the barrier layer 206a includes a barrier metal material, such as Ti, TiN, Ta, TaN, TiAl, or a combination thereof. A material of the gate dielectric layer 210a may be silicon oxide, for example. Similarly, another buried word line 202b also includes a conductive layer 204b (also referred to as a gate electrode), a barrier layer 206b, and a gate dielectric layer 210b. The barrier layer 206b wraps a lower portion of the conductive layer 204b, and the conductive layer 204b protrudes from a top surface of the barrier layer 206b. The gate dielectric layer 210b surrounds the barrier layer 206b to electrically isolate the barrier layer 206b from the substrate 100.

In addition, the initial structure further includes a silicon oxide layer 212, a tetraethoxysilane (TEOS) oxide layer 214, and an insulating material 208. In detail, the silicon oxide layer 212 is disposed on the substrate 100 and extends to cover the top surfaces of the isolation structures 101. The TEOS oxide layer 214 is disposed on the silicon oxide layer 212. The insulating material 208 is disposed on the TEOS oxide layer 214 and extends through the silicon oxide layer 212 and the TEOS oxide layer 214 to wrap upper portions of the conductive layers 204a and 204b. In an embodiment, a portion of the insulating material 208a wrapping the upper portion of the conductive layer 204a may be regarded as a portion of the word line 202a; another portion of the insulating material 208b wrapping the upper portion of the conductive layer 204b may be regarded as a portion of the word line 202b. A material of the insulating material 208 may be silicon nitride, for example.

In some embodiments, the word lines 202a and 202b are formed by following steps. Word-line openings 201 are formed in the substrate 100. The word-line openings 201 extend along the Y direction (as shown in FIG. 1) and penetrate through the active areas AA and the isolation structures 101. The gate dielectric layers 210a and 210b are conformally formed in the word-line openings 201, and may be formed by a chemical vapor deposition (CVD) method, a thermal oxidation method, an in-situ steam generation (ISSG) method, or the like. Next, a barrier material is conformally formed on the gate dielectric layers 210a and 210b and a conductive material is formed on the barrier material. The barrier material and the conductive material may be formed by a CVD method or a physical vapor deposition (PVD) method. Then, an etching back process is performed to remove a portion of the barrier material and a portion of the conductive material to respectively form the barrier layers 206a, 206b and the conductive layers 204a, 204b. In the embodiment, the etching selectivity of the etchant in the etching back process may be adjusted to further recess the barrier material, such that the top surface of the barrier layer 206a is concave from the top surface of the conductive layer 204a. Thereafter, the insulating material 208 is formed on the conductive layer 204a to cover the upper portion of the conductive layer 204a and the top surface of the barrier layer 206a, and may be formed by a CVD method or a PVD method.

Referring to FIG. 2B, a photoresist pattern 216 is formed on the insulating layer 208. In one embodiment, the photoresist pattern 216 corresponds to the word line sets 202 and is located in a range of opposite sidewalls 202s1 and 202s2 of the word line sets 202. That is, the photoresist pattern 216 covers the inner sidewalls IS (also referred to as second sides) of the word lines 202a and 202b, and exposes the outer sidewalls OS (also referred to as first sides) of the word lines 202a and 202b. In the case, there is a length L3 between a first sidewall 216s1 of the photoresist pattern 216 and the outer sidewall 202s1 of the corresponding word line 202a, and there is a length L4 between a second sidewall 216s2 of the photoresist pattern 216 and the outer sidewall 202s2 of the corresponding word line 202b. In some embodiments, the lengths L3 and L4 are at least greater than zero. In alternative embodiments, the length L3 may be 6 nm to 11 nm; and the length L4 may be 6 nm to 11 nm.

Referring to FIGS. 2B to 2D, a portion of the insulating material 208 and a portion of the gate dielectric layers 210a and 210b are removed by using the photoresist pattern 216 as a mask, so as to form a plurality of openings 12 within the outer sidewalls OS of the word lines 202a and 202b. In one embodiment, the openings 12 expose at least the upper sidewalls 100s of the substrate 100 in the active areas AA. In some embodiments, the openings 12 laterally extend from the interfaces IF between the outer sidewalls OS and the active areas AA of the word lines 202a and 202b toward the inner sidewalls IS of the word lines 202a and 202b. After forming the openings 12, the photoresist pattern 216 is removed to expose the top surface of the insulating material 208, as shown in FIG. 2D.

Referring to FIG. 2E, an epitaxial growth process is performed to form a plurality of epitaxial layers 220 on the upper sidewalls 100s of the substrate 100. The epitaxial layers 220 extend laterally from the upper sidewalls 100s of the substrate 100 into the word lines 202a and 202b, respectively. In one embodiment, the epitaxial layer 220 extends along a direction from the first sidewall 12s1 of the opening 12 toward the second sidewall 12s2 opposite to the first sidewall 12s1. As shown in FIG. 2E, there is a gap 221 between the epitaxial layer 220 and the second sidewall 12s2 of the opening 12. That is, the epitaxial layers 220 do not fill up the entire openings 12 and is not in contact with the second sidewalls 12s2 of the openings 12. In addition, since the epitaxial layers 220 are selectively formed on the upper sidewalls 100s of the substrate 100 through the epitaxial growth process, a material of the epitaxial layers 220 is derived from the substrate 100. For example, when the substrate 100 is a silicon substrate, the epitaxial layers 220 may be epitaxial silicon layers or epitaxial silicon germanium layers.

Referring to FIG. 2F, an insulating material 222 is formed on the TEOS oxide layer 214. In one embodiment, the insulating material 222 fills in the openings 12 and the gaps 221 and extends to cover the top surface of the TEOS oxide layer 214. In some embodiments, the insulating material 222 and the insulating material 208 have the same material, which may be silicon nitride, for example. In the case, the insulating material 222 and the insulating material 208 may be regarded as the same insulating material or layer to cover the upper portions of the epitaxial layers 220 and the conductive layers 204a and 204b. In alternative embodiments, the insulating material 222 and the insulating material 208 may also have different materials.

Referring to FIG. 2G, a planarization process is performed, and portions of the insulating materials 222 and 208 and the TEOS oxide layer 214 are removed to expose the epitaxial layers 220. The remaining insulating materials 222 and 208 (shown as dashed lines) may be collectively referred to as insulating layers 225a and 225b, which respectively wrap the upper portions of the conductive layers 204a and 204b, and the gate dielectric layers 210a and 210b extend to surround the insulating layers 225a and 225b. In one embodiment, the planarization process may be a chemical mechanical polishing (CMP) process or an etching back process. In the case, as shown in FIG. 2G, the top surfaces 220t of the epitaxial layers 220, the top surfaces 225t of the insulating layers 225a, 225b, the top surface 100t of the substrate 100, and the top surfaces 101t of the isolation structures 101 may be regarded as substantially coplanar. Herein, a word-line structure WL with the epitaxial layers 220 has been accomplished. As shown in FIG. 2G, the epitaxial layers 220 are respectively embedded between the upper portions of the outer sidewalls 202s1 and 202s2 of the word lines 202a and 202b and the substrate 100 in the active areas AA, and the epitaxial layers 220 are in (physical) contact with the substrate 100 in the active areas AA. In the embodiment, the epitaxial layers 220 may be regarded as an extension of the active areas AA, which can enlarge the contact area between the active areas AA and the to-be-formed capacitor contacts CC1 and CC2 (as shown in FIG. 2R).

In the present embodiment, the height D1 of the epitaxial layers 220 may be between 20 nm and 25 nm. The distance D2 between the bottom surfaces of the epitaxial layers 220 and the top surfaces of the barrier layers 206a and 206b may be between 73 nm and 93 nm. The distance D3 between the top surfaces 225t of the insulating layers 225a, 225b and the top surfaces of the conductive layers 204a, 204b may be between 55 nm and 65 nm. The distance D4 between the top surfaces of the conductive layers 204a and 204b and the top surfaces of the barrier layers 206a and 206b may be between 18 nm and 28 nm. In one embodiment, a ratio of the height D1 to the distance D4 may be 0.9 to 1.1. That is, the height or depth of the epitaxial layers 220 is approximately equal to the recessed depth of the barrier layers 206a, 206b. In the case, the recessed barrier layers 206a, 206b is able to increase the distance between the epitaxial layers 220 and the barrier layers 206a, 206b, thereby avoiding the leakage current issue caused by the gate induced drain leakage (GIDL).

Referring to FIG. 2H, a dielectric layer 116, a dielectric layer 118, a silicon oxide layer 120, a carbon layer 122 and a silicon oxynitride layer 124 are sequentially formed on the structure of FIG. 2G. Specifically, the dielectric layer 116 covers the active areas AA, the isolation structures 101, and the word line sets 202. In one embodiment, the dielectric layer 116 may be silicon nitride, ultra-low temperature oxide, or a combination thereof, and may be formed by a CVD method or a PVD method. In an embodiment, a material of the dielectric layer 118 may be a spin-on dielectric material. In one embodiment, a composite layer of the silicon oxide layer 120, the carbon layer 122 and the silicon oxynitride layer 124 may be regarded as a hard mask layer HM. In the embodiment, a material of the silicon oxide layer 120 is TEOS, for example. Next, a photoresist pattern 126 is formed on the silicon oxynitride layer 124 (or the hard mask layer HM). In an embodiment, the photoresist pattern 126 corresponds to the word line sets 202, and the photoresist pattern 126 has an area 126A which is orthographically projected on the top surface of the substrate 100 is located at least within a range 220R of the inner sidewalls of the adjacent epitaxial layers 220.

On the other hand, before forming the dielectric layer 118, the hard mask layer HM, and the photoresist pattern 126, the method further includes forming a plurality of bit line structures 102 extending along the X direction. The bit line structures 102 are not shown in the cross-sectional view along a line A-A' depicted in FIG. 1, while the related spatial relationship of the bit line structures 102 is shown in the top view of FIG. 1.

Referring to FIG. 2I, a portion of the hard mask layer HM, a portion of the dielectric layer 118 and a portion of the dielectric layer 116 are removed by using the photoresist pattern 126 as a mask, so as to form a plurality of openings 14. In an embodiment, as shown in FIG. 2I, the openings 14 expose the top surfaces 220t of the epitaxial layers 220, the top surface 100t of the substrate 100 in the active areas AA, and the top surfaces 101t of the isolation structures 101. In addition, the remaining silicon oxide layer 120a, the dielectric layer 118a, and the dielectric layer 116a may be regarded as a dielectric pillar, which has a cross-sectional profile with a narrower upper portion and a wider lower portion.

Referring to FIG. 2J, a conductive material 128 is formed on the structure of FIG. 2I. The conductive material 128 is filled in the openings 14 and covers a top surface 120t of the silicon oxide layer 120a. In one embodiment, the conductive material 128 may be polysilicon, and may be formed by a CVD method.

Referring to FIG. 2K, an etching back process is performed to remove a portion of the conductive material 128, so that the top surface 128t of the conductive layer 128a is lower than the top surface 120t of the silicon oxide layer 120a. In the case, the dielectric layer 118a separates two adjacent conductive layers 128a as shown in FIG. 2K.

Referring to FIG. 2L, a dielectric layer 130 is formed on the structure of FIG. 2K. The dielectric layer 130 is conformally formed on the conductive layer 128a, the dielectric layer 118a, and the silicon oxide layer 120a. Since there is a height difference between the top surface 128t of the conductive layer 128a and the top surface 120t of the silicon oxide layer 120a, the top surface of the dielectric layer 130 may be a continuous uneven structure, for example. The dielectric layer 130 on the silicon oxide layer 120a is a convex portion; and the dielectric layer 130 on the conductive layer 128a is a concave portion. As shown in FIG. 2L, the dielectric layer 130 on the substrate 100 in the second region R2 has recessed openings 16, and the recessed openings 16 correspond to the isolation structures 101 in the substrate 100. In an embodiment, a material of the dielectric layer 130 may be silicon nitride.

Referring to FIG. 2M, an etching process is performed to remove a portion of the dielectric layer 130 and a portion of the conductive layer 128a, so as to form openings 18 in the conductive pillar 128b and the dielectric layer 130a in the second region R2. The openings 18 expose the top surfaces 101t of the isolation structures 101 in the second region R2. In one embodiment, the opening 18 divided one conductive layer 128a into two conductive pillars 128b, as shown in FIG. 2M. Since the openings 18 may be formed to align with the isolation structures 101 in the second region R2 without using a lithography process, the openings 18 may be referred to as self-aligned openings.

Referring to FIG. 2N, a dielectric material 132 is formed on the structure of FIG. 2M. The dielectric material 132 is filled in the openings 18 and extends to cover the dielectric layer 130a and the silicon oxide layer 120a. In an embodiment, the dielectric material 132 may be silicon nitride, and may have the same material as the dielectric layer 130a. In alternative embodiments, the dielectric material 132 and the dielectric layer 130a may also have different materials.

Referring to FIG. 2O, a planarization process is performed to remove a portion of the dielectric material 132, the dielectric layer 130a, the silicon oxide layer 120a, and a portion of the dielectric layer 118a to expose the top surfaces 128t of the conductive pillars 128b and the top surface 118t of the dielectric layer 118b. In one embodiment, the planarization process may be a CMP process or an etching back process.

Referring to FIG. 2P, an etching process is performed to remove a portion of the conductive pillar 128b to form openings 20 on the conductive pillars 128c1 and openings 22 on the conductive pillars 128c2. In one embodiment, the etching process may be a wet etching process or a dry etching process. In an embodiment, as shown in FIG. 2P, the bottom surfaces of the openings 20 and the bottom surfaces of the openings 22 are coplanar.

Referring to FIG. 2Q, a barrier layer 136 is conformally formed in the openings 20 and 22. In one embodiment, the barrier layer 136 covers and contacts the surfaces of the conductive pillars 128c1, 128c2. The material of the barrier layer 136 may be, for example, Ti, TiN, Ta, TaN, TiAl, or a combination thereof, and may be formed by a CVD method or a PVD method. Next, a metal layer 138 is formed on the barrier layer 136. In one embodiment, the metal layer 138 is wrapped by the barrier layer 136. The material of the metal layer 138 may be, for example, W, and may be formed by a PVD method. In the embodiment, the barrier layer 136 and the metal layer 138 in the openings 20 and 22 may be referred to as landing pads 134, which may be used to connect the conductive pillars 128c1, 128c2 and the capacitors 142 formed subsequently. In another embodiment, the landing pads 134 may also be constituted of a metal layer and a metal silicide layer sandwiched between the metal layer and the conductive pillars 128c1 and 128c2.

As shown in FIG. 2Q, the composite structure of the conductive pillar 128c1 and the landing pad 134 may be regarded as a capacitor contact CC1; the composite structure of conductive pillar 128c2 and landing pad 134 may be regarded as a capacitor contact CC2. The capacitor contact CC1 is disposed at one terminal of the active area AA, and is electrically connected to the active area AA and the to-be-formed capacitor 142. The capacitor contact CC2 is disposed at another terminal of the active area AA, and is electrically connected to the active area AA and the to-be-formed capacitor 142 (as shown in FIG. 2R).

In one embodiment, the capacitor contact CC1 extends along a direction toward the adjacent word line 202a and is in contact with the top surface of the corresponding epitaxial layer 220. In other words, the capacitor contact CC1 covers not only the active area AA, but also the epitaxial layer 220. Specifically, the bottom of the capacitor contact CC1 has an area or width W1, the top of the active area AA has an area or width W2, and the top of the epitaxial layer 220 has an area or width W3. In an embodiment, the width W1 is at least larger than the width W2 (that is, W1>W2). In the embodiment, the width W1 is substantially equal to a sum of the width W2 and the width W3 (that is, W1=W2+W3). In one embodiment, the width W1 may be between 40 nm and 51 nm, the width W2 may be between 35 nm and 40 nm, and the width W3 may be between 5 nm and 11 nm. Based on the above, the present embodiment can maximize the contact area between the capacitor contact CC1 and the active area AA, so as to reduce the resistance value between the capacitor contact CC1 and the active area AA, thereby increasing the reading speed of the memory device 10, and further improving the efficiency and the reliability. Similarly, the capacitor contact CC2 has the same effect.

In addition, as shown in FIG. 2Q, the dielectric pillars 132a respectively correspond to the isolation structures 101 in the substrate 100 of the second region R2, so as to electrically isolate two adjacent conductive pillars 128c1, 128c2 (or capacitor contacts CC1, CC2). In the embodiment, the dielectric pillars 132a are formed by filling in the self-aligned openings 18 without performing any additional lithography process and etching process. Accordingly, the dielectric pillars 132a may be regarded as self-aligned dielectric structures.

Referring to FIG. 2R, after forming the landing pads 134, a dielectric layer 140 is formed on the substrate 100. Thereafter, a plurality of capacitor openings 24 are formed in the dielectric layer 140, and a plurality of capacitors 142 are formed in the capacitor openings 24, respectively. The capacitors 142 are electrically connected to the active areas AA through the capacitor contacts CC1 and CC2, respectively. Specifically, each capacitor 142 includes a lower electrode 142a, an upper electrode 142c, and a dielectric layer 142b. The dielectric layer 142b is located between the lower electrode 142a and the upper electrode 142c. The lower electrodes 142a are electrically connected to the capacitor contacts CC1 and CC2, respectively. In an embodiment, the material of the dielectric layer 140 may be, for example, silicon oxide. The material of the lower electrode 142a and the upper electrode 142c is, for example, titanium nitride, tantalum nitride, tungsten, titanium tungsten, aluminum, copper, or metal silicide. The dielectric layer 142b may include a high dielectric constant material layer (i.e., a dielectric material with a dielectric constant higher than 4), and a material thereof includes, for example, oxides of the following elements, such as hafnium, zirconium, aluminum, titanium, lanthanum, yttrium, gadolinium, tantalum or aluminum nitride or any combination of the elements.

In summary, in the present invention, the epitaxial layers laterally extend from the upper sidewalls of the substrate, so as to increase the contact area between the capacitor contacts and the active areas and reduce the resistance of the capacitor contacts, thereby enhancing the reliability and the process window of the memory device. In addition, the present invention further recesses the barrier layer to increase the distance between the epitaxial layers and the barrier layers, thereby avoiding the leakage current issue caused by the gate induced drain leakage (GIDL).

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A word-line structure, comprising:
  a word line, embedded in a substrate, wherein the word line comprises
    a conductive layer;
    a barrier layer wrapping a lower portion of the conductive layer;
    an insulating layer wrapping an upper portion of the conductive layer; and
    a gate dielectric layer surrounding the insulating layer and the barrier layer to electrically isolate the barrier layer from the substrate; and
  an epitaxial pattern, disposed between the insulating layer and the substrate and in contact with the substrate.

2. The word-line structure according to claim 1, wherein a material of the epitaxial pattern is from the substrate.

3. The word-line structure according to claim 1, wherein the conductive layer protrudes from a top surface of the barrier layer.

4. The word-line structure according to claim 1, wherein a top surface of the epitaxial pattern, a top surface of the insulating layer, and a top surface of the substrate are coplanar.

5. The word-line structure according to claim 1, wherein the word line extends along a Y direction, the epitaxial pattern has a plurality of epitaxial layers, the plurality of epitaxial layers are separated from each other along the Y direction and disposed at one side of the word line.

6. A memory device, comprising:
  a substrate, having a plurality of active areas;
  a plurality of word lines, disposed in parallel in the substrate along a Y direction;
  a plurality of capacitors, respectively disposed on two terminals of long sides of the plurality of active areas;
  a plurality of capacitor contacts, respectively disposed between the plurality of capacitors and the plurality of active areas; and
  a plurality of epitaxial layers, respectively disposed between the plurality of word lines and the plurality of active areas, wherein the plurality of epitaxial layers laterally extend from upper sidewalls of the substrate into the plurality of word lines respectively.

7. The memory device according to claim 6, wherein one of the plurality of capacitor contacts has a bottom area greater than a top area of a corresponding active area.

8. The memory device according to claim 6, wherein the plurality of epitaxial layers are respectively disposed at overlapping positions between the plurality of capacitor contacts and the plurality of word lines.

9. The memory device according to claim 8, wherein the plurality of capacitor contacts extend along a direction toward an adjacent word line and are in contact with a corresponding epitaxial layer.

10. The memory device according to claim 6, wherein one of the plurality of word lines comprises:
  a conductive layer embedded in the substrate;
  a barrier layer wrapping a lower portion of the conductive layer;
  an insulating layer wrapping an upper portion of the conductive layer; and
  a gate dielectric layer surrounding the insulating layer and the barrier layer to electrically isolate the barrier layer from the substrate.

11. The memory device according to claim 10, wherein a top surface of the barrier is concave from a top surface of the conductive layer.

12. The memory device according to claim 10, wherein top surfaces of the plurality of epitaxial layers, a top surface of the insulating layer, and a top surface of the substrate are coplanar.

13. The memory device according to claim 6, wherein a material of the plurality of epitaxial layers is from the substrate.

14. The memory device according to claim 6, wherein the plurality of epitaxial layers are separated from each other along the Y direction and disposed at one side of a corresponding word line.

15. A method of manufacturing a memory device, comprising:
    providing a substrate having a plurality of active areas;
    forming a plurality of word lines in the substrate, the plurality of word lines extending along a Y direction and penetrating through the plurality of active areas;
    removing a portion of the plurality of word lines at a first side to form a plurality of openings, the plurality of openings at least expose upper sidewalls of the substrate in the plurality of active areas;
    performing an epitaxial growth process to form a plurality of epitaxial layers on the upper sidewalls of the substrate; and
    filling in the plurality of openings with an insulating material.

16. The method of manufacturing the memory device according to claim 15, wherein the forming the plurality of word lines comprises:
    forming a word-line opening in the substrate;
    conformally forming a gate dielectric layer in the word-line opening;
    conformally forming a barrier layer on the gate dielectric layer;
    forming a conductive layer on the barrier layer, wherein the conductive layer protrudes from a top surface of the barrier layer; and
    forming insulating layer on the conductive layer to cover an upper portion of the conductive layer and the top surface of the barrier layer.

17. The method of manufacturing the memory device according to claim 16, wherein the forming the plurality of openings comprises:
    forming a photoresist pattern on the substrate, the photoresist pattern covering a second side of the plurality of word lines while exposing the first side of the plurality of word lines; and
    removing a portion of the insulating layer and a portion of the gate dielectric layer by using the photoresist pattern as a mask, so as to form the plurality of openings within the first side of the plurality of word lines.

18. The method of manufacturing the memory device according to claim 17, wherein the plurality of openings laterally extend along a direction from an interface between the first side of the plurality of word lines and the plurality of active areas toward the second side of the plurality of word lines.

19. The method of manufacturing the memory device according to claim 15, wherein the plurality of epitaxial layers respectively extend from first sidewalls of the plurality of openings, and gaps are included between the plurality of epitaxial layers and second sidewalls of the plurality of openings.

20. The method of manufacturing the memory device according to claim 15, further comprising:
    forming a plurality of capacitor contacts on two terminals of long sides of the plurality of active areas; and
    forming a plurality of capacitors on the plurality of capacitor contacts.

* * * * *